United States Patent
Yang

[11] Patent Number: 6,040,603
[45] Date of Patent: Mar. 21, 2000

[54] ELECTROSTATIC DISCHARGE PROTECTION CIRCUIT EMPLOYING MOSFETS HAVING DOUBLE ESD IMPLANTATIONS

[75] Inventor: Jiuun-Jer Yang, Chin-Men Hsien, Taiwan

[73] Assignee: Worldwide Semiconductor Manufacturing Corporation, Chin-Men Hsien, Taiwan

[21] Appl. No.: 09/303,769

[22] Filed: Apr. 30, 1999

[51] Int. Cl.$^7$ .................................................. H01L 21/336
[52] U.S. Cl. ............................ 257/344; 257/345; 257/546
[58] Field of Search ..................................... 257/344, 345, 257/546, 388

[56] References Cited

U.S. PATENT DOCUMENTS 5,440,165  8/1995  Mitsunaga et al. ...................... 257/408
5,466,957  11/1995  Yuki et al. ................................ 257/344
5,512,770  4/1996  Hong ........................................ 257/345
5,903,029  5/1999  Hayashida et al. ...................... 257/344

*Primary Examiner*—Donald L. Monin, Jr.
*Attorney, Agent, or Firm*—Blakely Sokoloff Taylor and Zafman

[57] ABSTRACT

A transistor formed in a semiconductor substrate having improved ESD protection is disclosed. The transistor includes a first ESD implant formed underneath the source region and the drain region of the transistor. The first ESD implant has the same impurity type as the source region and the drain region. Further, a second ESD implant is formed underneath the first ESD implant, the second ESD implant having an impurity type opposite to that of said first ESD implant. The second ESD implant also is spaced apart vertically from the first ESD implant.

1 Claim, 2 Drawing Sheets

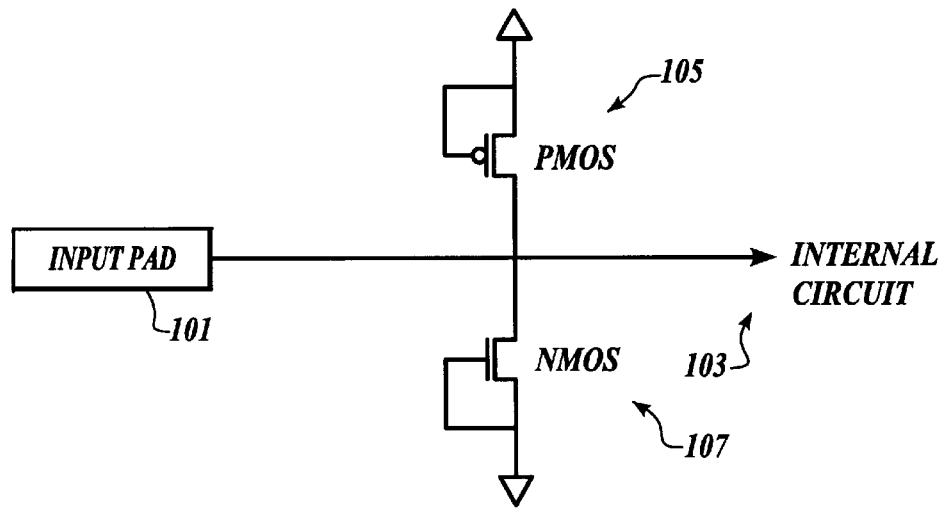
Fig. 1 *(PRIOR ART)*
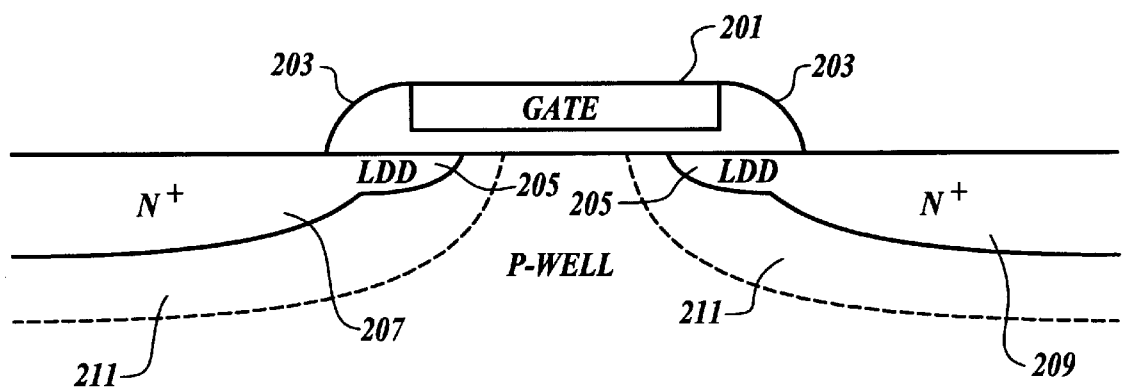
Fig. 2 *(PRIOR ART)*

ELECTROSTATIC DISCHARGE PROTECTION CIRCUIT EMPLOYING MOSFETS HAVING DOUBLE ESD IMPLANTATIONS

FIELD OF THE INVENTION

The present invention relates to an electrostatic discharge protection circuit, and more particularly, to a circuit that uses MOSFETs having double implantations.

BACKGROUND OF THE INVENTION

Electrostatic discharge (ESD) refers to a phenomena wherein a charged device of a given potential suddenly discharges carriers to a separate device of lower potential. The discharge occurs over a short time frame and, therefore, results in a momentarily large current, if the resistance of the discharge path is kept low. The most common example of ESD occurs when a human walks over a carpeted area in low humidity, thereby collecting an electrostatic charge. If the charged human touches a semiconductor device, an electrostatic discharge takes place from the human to elements of the semiconductor device. Such discharges can damage the semiconductor device unless means are provided for clamping the large voltages and diverting the currents resulting from the electrostatic discharge.

FIG. 1 shows a prior art schematic diagram of a typical electrostatic discharge protection circuit for IC input pads. An input pad 101 is provided for interface with the internal circuit of the IC 103. Disposed between the input pad 101 and the internal circuit 103 are a pMOS 105 and an nMOS 107. The pMOS and nMOS devices have their gate electrodes connected to their sources. In general, for input pad protection, the junction breakdown voltages of the nMOS 107 and pMOS 105 should be smaller than the gate oxide breakdown voltage and higher than 1.1 $V_{dd}$. However, as devices are miniaturized, the thickness of the gate oxide used in the MOSFET devices becomes smaller. The "snapback" effect becomes difficult to control for deep submicron technology. The snapback effect is detailed in U.S. Pat. No. 5,804,860 to Amerasekera.

Generally, an ESD pulse will generate a large amount of joule heating within the MOSFET devices. However, deep submicron devices utilize shallow junctions for better short channel effect control, which reduces the joule heating capability. Therefore, in order to reduce the maximum current density and provide a uniform current path, one prior art practice uses an ESD implant to broaden the source/drain profiles. Thus, as can be seen in FIG. 2, a conventional lightly doped drain MOSFET includes a gate 201, sidewall spacers 203, lightly doped drain regions 205, and source and drain implants 207 and 209, respectively. Additionally, an ESD implant 211 is used to broaden the source drain profiles. Typically, the ESD implant 211 is an implant having the same conductivity type of the source and drain, but of lower concentration. Therefore, the ESD implant 211 is a n-type implant and can be, for example, formed by phosphorous implants. Furthermore, although an nMOS device is shown in FIG. 2, a pMOS transistor can be easily formed by reversing the implant types. A more detailed discussion of this prior art may be found in A. Amerasekera and C. Duvvury, "ESD in Silicon Integrated Circuits," John Wiley and Sons, Inc. (1996), at page 180.

Nevertheless, the prior art still does not provide adequate control of snapback trigger voltage. The present invention addresses this problem.

SUMMARY OF THE INVENTION

A transistor formed in a semiconductor substrate having improved ESD protection is disclosed. The transistor comprises: a gate structure formed atop of said semiconductor substrate, said gate structure comprised of a conducting layer formed atop a thin gate oxide layer; sidewall spacers formed on the sidewalls of said gate structure; lightly doped drain regions formed in said semiconductor substrate and substantially underneath said sidewall spacers; a source region formed in said semiconductor substrate and adjacent to one of said sidewall spacers; a drain region formed in said semiconductor substrate and adjacent to a second one of said sidewall spacers; a first ESD implant formed underneath said source region and said drain region, said first ESD implant having the same impurity type as said source region and said drain region; and a second ESD implant formed underneath said first ESD implant, said second ESD implant having an impurity type opposite to that of said first ESD implant, said second ESD implant also being spaced apart vertically from said first ESD implant.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 1 is a schematic diagram of a prior art ESD protection circuit;

FIG. 2 is a cross section of a semiconductor substrate illustrating a prior art transistor designed to reduce ESD effects;

DETAILED DESCRIPTION OF THE PREFERRED EMBODIMENT

Figure 3:
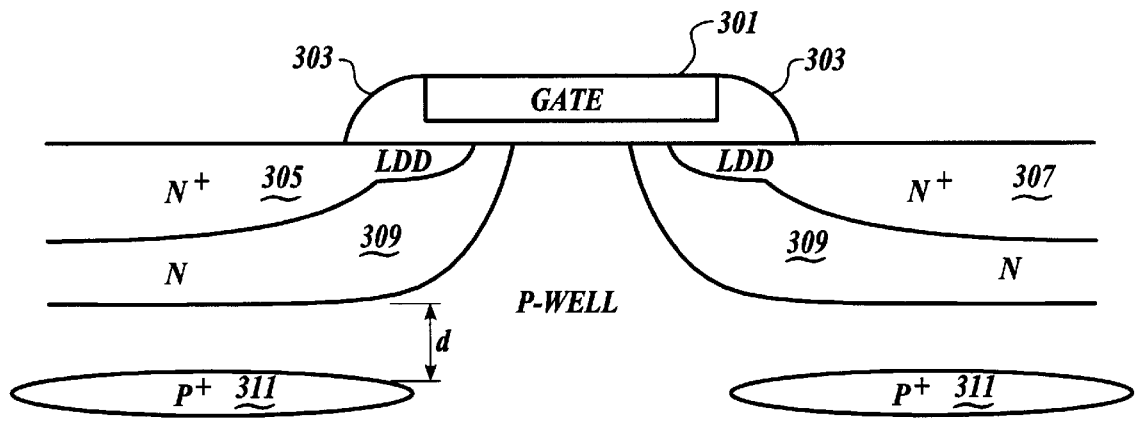
FIG. 3 is a cross section of a semiconductor substrate illustrating a transistor formed in accordance with the present invention.

FIG. 3 is a cross section view of a MOSFET formed in accordance with the present invention. The MOSFET includes a gate 301 and sidewall spacers 303. As is conventional in the prior art, the sidewall spacers 303 are used to form lightly doped drain (LDD) structures. Source and drain regions 305 and 307, respectively, are formed using ion implants. Typically, for a 0.5 micron nMOS, the thickness of the gate oxide is approximately 120 angstroms. The lightly doped drain is formed by phosphorous implantation with an energy of 40 Kev to a total dosage of $4 \times 10^{13}/cm^2$. The source and drain regions 305 and 307 are formed using, for example, an arsenic ion implant at an energy of 50 Kev to a dosage of $3 \times 10^{15}/cm^2$.

Next, a separate ion implant mask is used to form the first ESD implant 309. The mask should be formed such that the ESD implant 309 will wholly encompass the source 305, drain 307, and the lightly doped drain regions. The ESD implant 309 is used to minimize the joule heating effect and the impurity type is the same as the source and drain regions 305 and 307. Preferably, in one actual embodiment, the ESD implant 309 uses a phosphorous species at 50 Kev with a dosage of $1 \times 10^{15}/cm^2$.

Using the same mask as used for the ESD implant 109, a second ESD implant 311 is formed underneath the first ESD implant 309. However, the second ESD implant 311 has an impurity type that is opposite to the source and drain regions. The second ESD implant 311 should be located under the source and drain regions. Additionally, there preferably should be spacing between the first ESD implant 309 and the second ESD implant 311. The vertical distance between the second ESD implant 311 and the first ESD implant 309 (designated as "d" in FIG. 3) determines the breakdown voltage. The greater the distance d, the greater the breakthrough voltage.

In order to form a heavily doped and sharp (delta-doped) second ESD implant layer 311, the mass of the implant species should be as heavy as possible. Specifically, for example, the second ESD implant 311 may use an indium dopant at a power of 700 Kev to a dopant concentration of $2 \times 10^{15}/\text{cm}^2$. Alternatively, boron may also be used for the second ESD implant 311.

Figure 4:
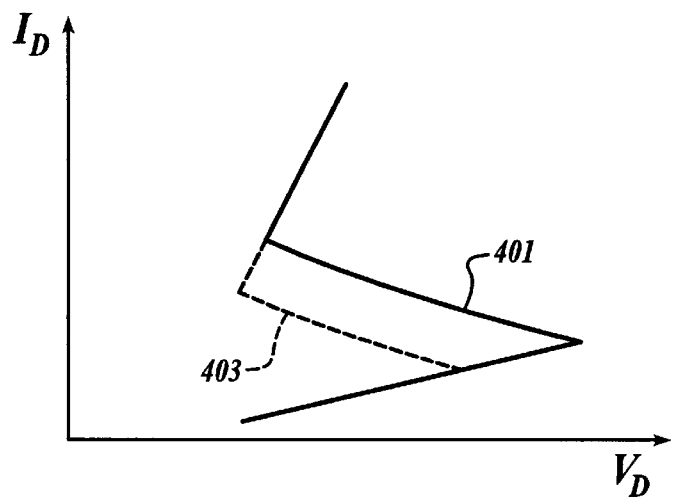
FIG. 4 is a graph illustrating the improved snapback trigger voltage characteristics of the present invention compared to the prior art.

It has been found that the addition of the second ESD implant 311 provides improved snapback trigger voltage as compared with the prior art. A comparison (in qualitative terms) is seen in FIG. 4 where the prior art snapback voltage is charted by reference numeral 401 and the snapback voltage of the present invention is shown by the dash line and reference numeral 403.

In addition, although FIG. 3 shows an nMOS, the approach of the present invention can easily be extrapolated over to a pMOS by simply changing the dopant types.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A transistor formed in a semiconductor substrate having improved FSD protection comprising:

a gate structure formed atop of said semiconductor substrate, said gate structure comprised of a conducting layer formed atop a thin gate oxide layer;

sidewall spacers formed on the sidewalls of said gate structure;

lightly doped source and drain regions formed in said semiconductor substrate and substantially underneath said sidewall spacers;

a source region formed in said semiconductor substrate and adjacent to one of said sidewall spacers;

a drain region formed in said semiconductor substrate and adjacent to a second one of said sidewall spacers:

a first ESD implant formed underneath said source region and said drain region, said first ESD implant having the same impurity type as said source region and said drain region;

wherein said source region, said drain region, and said lightly doped drain regions are within said first ESD implant; and a second ESD implant formed underneath said first ESD implant, said second ESD implant having an impurity type opposite to that of said first ESD implant, said second ESD implant also being spaced apart vertically from said first ESD implant.

* * * * *